(12) United States Patent
Klesing et al.

(10) Patent No.: US 6,822,168 B2
(45) Date of Patent: Nov. 23, 2004

(54) CABLE HARNESS ARRANGEMENT

(75) Inventors: Joachim Klesing, München (DE); Ferdinand Hahn, Diessen (DE); Peter Hoffmann, Ering (DE)

(73) Assignee: Webasto Vehicle Systems International GmbH, Stockdorf (DE)

( * ) Notice: Subject to any disclaimer, the term of this patent is extended or adjusted under 35 U.S.C. 154(b) by 312 days.

(21) Appl. No.: 10/001,199

(22) Filed: Dec. 4, 2001

(65) Prior Publication Data

US 2002/0079129 A1 Jun. 27, 2002

(30) Foreign Application Priority Data

Dec. 1, 2000 (DE) .......................................... 100 60 070

(51) Int. Cl.$^7$ ................................................ H05K 1/00
(52) U.S. Cl. ...................... 174/254; 174/72 A; 174/251
(58) Field of Search ................................. 174/254, 250, 174/251, 260, 268, 72 A, 117 F, 104, 117 FF, 115, 72 B, 72 TR, 71 C, 71 B; 361/749, 750, 751; 439/67, 76.1, 77, 76.2, 492

(56) References Cited

U.S. PATENT DOCUMENTS

| 3,736,366 | A | * | 5/1973 | Wittenberg .................... 174/34 |
| 3,763,306 | A | * | 10/1973 | Marshall ....................... 174/115 |
| 4,357,750 | A | * | 11/1982 | Ostman ......................... 29/847 |
| 4,406,915 | A | * | 9/1983 | Lang ........................ 174/117 F |
| 4,635,359 | A | * | 1/1987 | Nozick .......................... 29/878 |
| 5,446,239 | A | * | 8/1995 | Mizutani et al. ............... 174/36 |
| 5,502,287 | A | | 3/1996 | Nguyen |
| 6,438,301 | B1 | * | 8/2002 | Johnson et al. .............. 385/101 |

FOREIGN PATENT DOCUMENTS

JP          05-62543        3/1993

* cited by examiner

Primary Examiner—David A. Zarneke
Assistant Examiner—I B Patel
(74) Attorney, Agent, or Firm—Nixon Peabody LLP; David S. Safran

(57) ABSTRACT

A cable harness arrangement, especially for connection of the individual components of a motor vehicle, is provided which includes a flexible printed circuit board having at least one flat printed circuit and at least one non-flat conductor. The non-flat conductor is fixed at least partially by the flexible printed circuit board.

9 Claims, 1 Drawing Sheet

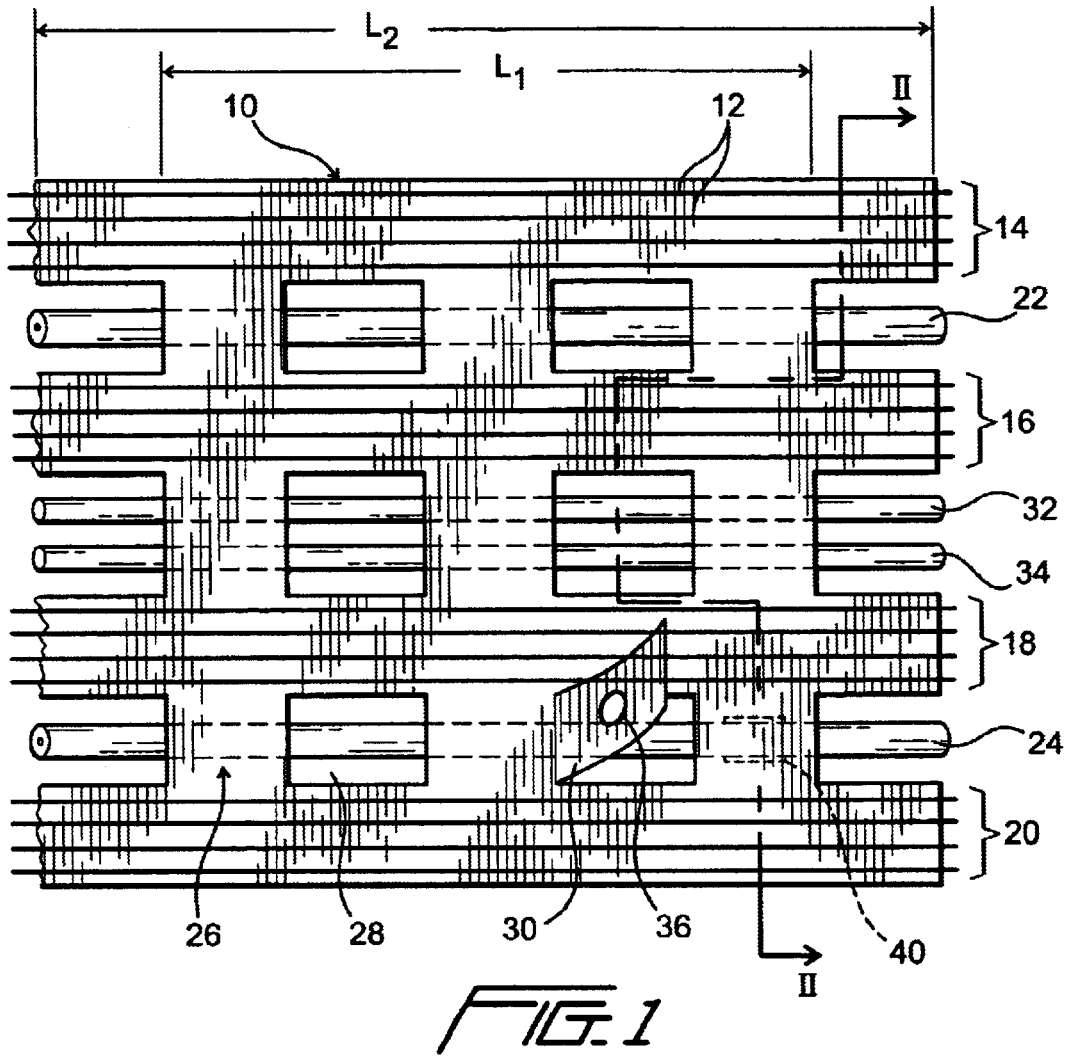
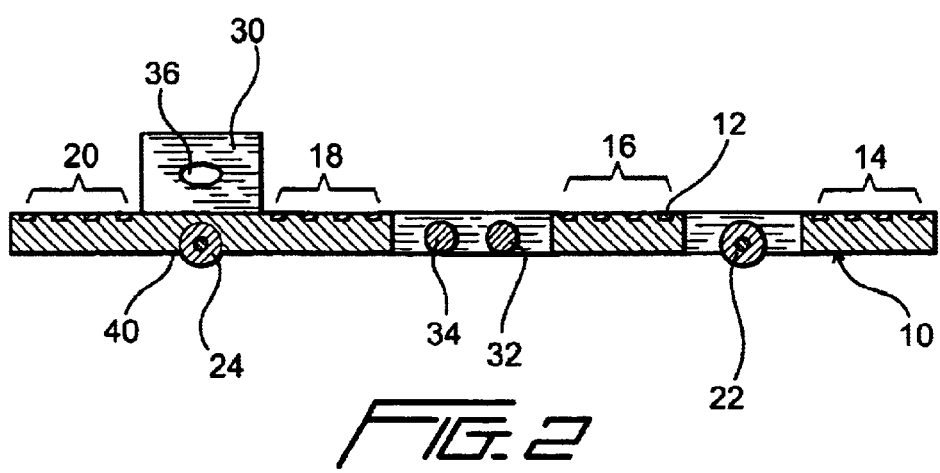

CABLE HARNESS ARRANGEMENT

BACKGROUND OF THE INVENTION

1. Field of the Invention

This invention relates to a cable harness arrangement, especially for connection of the individual components of a motor vehicle with a flexible printed circuit board (FPC) which has at least one flat printed conductor and at least one non-flat conductor.

2. Description of Related Art

In many technical devices, and especially in motor vehicle construction, a host of components must be interconnected via power supply and data lines, such as, for example, in a motor vehicle in which the individual electrical components, such as lights, instruments and electrical drives, must be connected to the vehicle's electrical system and to suitable switching means.

To make the installation of the individual cables easier, several cables and connecting lines are combined into a cable harness in which the individual conductors have a length corresponding to their later installation position and are already provided with the corresponding connecting means. Basically there are two types of these cable harnesses. Specifically, on the one hand, there are those harnesses in which several individually insulated conductors are combined into a bundle and optionally jacketed, and on the other, there are flexible printed circuit boards (so-called FPC cable harnesses) in which several printed conductors are printed onto a flexible flat circuit board. Usually a cover layer is applied over the printed conductors so that they are integrated into the printed circuit board.

Since the type of conductor depends on the requirements of the components to be installed and, in many components, both cable harnesses made of strands and also cable harnesses with flexible printed circuit boards must be installed, and since not all conductors to be connected can be accommodated in one cable harness, i.e. either a FPC cable harness or cable harness with non-flat conductors such as stranded wires or coaxial cables, several cable harnesses must be installed individually and fixed. For example, when connecting a car radio, in which copper stranded cables are usually used for connection to a power supply, there is one coaxial cable for connection to an antenna and a data line which has a flexible printed circuit board for connection of the radio to, for example, a navigation system.

SUMMARY OF THE INVENTION

One object of the present invention is to provide a cable harness arrangement by which the connection and installation of components to be connected to conductors, especially of a motor vehicle, can be simplified.

The above object along with other objects are achieved by providing a cable harness arrangement, especially for connecting individual components of a motor vehicle to a flexible printed circuit board which has at least one flat printed circuit, and with at least one non-flat conductor. The non-flat conductor is at least partially fixed by the flexible printed circuit board, and preferably the non-flat conductor is embedded in the flexible printed circuit board. Since, in this way, only one common cable harness need be installed and fixed, separate holders for the non-flat conductors, e.g. coaxial cables, insulated metal wires, stranded metal conductor or optical fibers, can be abandoned thereby greatly reducing installation costs.

In particular, the non-flat conductors can be integrated into the flexible printed circuit board over only part of its length, and then the flexible printed circuit board can have lands for integration of the non-flat conductor and recesses between the connectors. One such embodiment of the cable harness arrangement of the present invention is advantageous in many respects. On the one hand, as a result of the recesses, the weight of the cable harness is reduced while at the same time the flexibility of the cable harness is increased. On the other hand, the lands, or the recesses located between the lands, can be used for fixing the cable harness, for example, on a motor vehicle body. Thus, for example, a cable harness provided with lands could be fixed on the vehicle using a cable connector which is threaded through the two recesses bordering one land.

In another embodiment of the invention, however, also at least one part of the surface areas of the flexible printed circuit board can be recessed between the lands in a manner forming flaps, which can be folded out of the plane of the circuit board, for fixing the cable harness arrangement. These flaps could be provided with openings, in the simplest case, in order to lock the cable harness securely on the motor vehicle by, for example, using clips which are inserted through the recesses and through a recess provided on the motor vehicle body.

BRIEF DESCRIPTION OF THE DRAWING

The FIGS. 1 & 2 illustrate one embodiment of the cable harness arrangement of the present invention including a flexible circuit board, FIG. 1 being a plan view and FIG. 2 being a sectional view taken along line II—II of FIG. 1.

DETAILED DESCRIPTION OF THE INVENTION

Reference is now made to one exemplary embodiment of the present invention shown in the figure for the installation of a cable harness in a motor vehicle. Of course, the present invention can be used in the same way for any devices in which FPC cable and other conductors, as are called non-flat conductors herein, are to be installed at the same time.

The figure illustrates a flexible circuit board 10 which has a plurality of flat printed circuits 12. In this embodiment, there are sixteen circuits 12 combined to form four, four-wire flat conductors 14, 16, 18 and 20 at a time.

Between flat conductors 14 and 16 and between flat conductors 18 and 20, there is one coaxial cable 22 and 24, respectively, which each are integrated on lands 26 into flexible circuit board 10 as shown at 40. Parts of the flat areas of flexible circuit board 10 as shown at 40 are left open when the circuit board is removed from the mold, or removed later, as is illustrated, for example, at recess 28. while another part of the flat areas of the circuit board is recessed only so far from the circuit board to form flaps which can be folded out of the plane of the circuit board, as shown at 30. The cable harness can then be easily fixed using lands 26 and/or flaps 30, for example, by inserting a cable connector, or a similar mounting means, through two recesses 28 bordering land 26 and being attached to the body. If there are flaps 30, they can be provided with holes 36 to fix the cable harness formed by the flexible circuit board 10 by using suitable fasteners such as cable connectors, clips, screws, rivets, etc.

Several non-flat conductors can also be integrated into the individual lands 26, as illustrated in the figure by the integration of two copper stranded wires 32 and 34 in the middle area of the printed circuit board 10.

It should be understood that any number and any arrangement of lands 26 can be selected. Thus, for example, it can be advantageous to make the distance between the two lands 26 larger when a coaxial cable is integrated into flexible circuit board 10 and the circuit board 10 is to be bent for positioning in one corner or along one step; for the coaxial cable, on the other hand, a larger bending radius is necessary.

As is often the case in cable harnesses, individual conductors or individual groups of conductors can have a different length. Thus, in the embodiment shown in the FIGURE, especially the individual flat conductors 14, 16, 18, and 20 (fundamentally also the individual circuits within the flat conductors), the coaxial cables 22 and 24 and the copper stranded wires 32 and 34, all could have a different individual length and could be provided with connecting means (not shown), preferably plugs, on their ends.

As already mentioned, basically any type of conductors together with flexible printed circuits can be integrated into cable harnesses using the concept explained here. Examples of these conductors include especially metal stranded wires, insulated metal wires, coaxial cables and optical fibers.

We claim:

1. A cable harness arrangement for connecting the individual components of a motor vehicle, comprising:
   a flexible printed circuit board having at least one flat printed circuit and at least one non-flat conductor, wherein the non-flat conductor is partially fixed to the flexible printed circuit board.

2. The cable harness arrangement of claim 1, wherein the non-flat conductor is secured over only part of its length to the flexible printed circuit board.

3. The cable harness arrangement of claim 2, wherein the flexible printed circuit board includes lands to which the at least one non-flat conductor is secured.

4. The cable harness arrangement of claim 3, wherein the flexible printed circuit board includes recesses between the lands.

5. The cable harness arrangement of claim 3, wherein the flexible printed circuit board includes holding means between the land for fixing the cable harness arrangement.

6. The cable harness arrangement of claim 5, wherein at least part of a surface area of the flexible printed circuit board is recessed between the lands in a manner forming flaps that are foldable into a position out of a plane of the circuit board for fixing the cable harness arrangement.

7. The cable harness arrangement of claim 1, wherein the at least one non-flat conductor is at least one of a coaxial cable, an insulated metal wire, metal stranded wire and an optical fiber.

8. The cable harness arrangement of claim 1, wherein said at least one flat printed circuit includes a plurality of flat printed circuits, said at least one non-flat conductor being located between two of said plurality of flat printed circuits.

9. The cable harness arrangement of claim 1, wherein said at least one flat printed circuit and said at least one non-flat conductor have a different length.

\* \* \* \* \*